United States Patent [19]

Murakami et al.

[11] Patent Number: 5,023,199
[45] Date of Patent: Jun. 11, 1991

[54] METHOD OF DIFFUSING ZN INTO COMPOUND SEMICONDUCTOR

[75] Inventors: Takashi Murakami; Takashi Motoda, both of Itami, Japan

[73] Assignee: Mitsubishi Denki Kabushiki Kaisha, Japan

[21] Appl. No.: 461,069

[22] Filed: Jan. 4, 1990

[30] Foreign Application Priority Data

Mar. 31, 1989 [JP] Japan .................................. 1-83279

[51] Int. Cl.$^5$ .......................................... H01L 21/223
[52] U.S. Cl. .................................. 437/167; 437/160; 437/161; 437/987; 148/DIG. 95; 372/45; 372/46
[58] Field of Search ............... 437/987, 160, 161, 167, 437/129; 148/DIG. 95, DIG. 32; 372/45, 46

[56] References Cited

U.S. PATENT DOCUMENTS

| | | | |
|---|---|---|---|
| 4,371,967 | 2/1983 | Wada et al. ......................... | 437/129 |
| 4,479,222 | 10/1984 | Hawrylo ............................. | 437/129 |
| 4,835,117 | 5/1989 | Ohba et al. ................... | 148/DIG. 95 |
| 4,852,110 | 7/1989 | Fujii et al. .............................. | 372/45 |
| 4,857,971 | 8/1989 | Burnham ................................ | 357/17 |
| 4,922,499 | 5/1990 | Nitta et al. ............................ | 372/46 |

OTHER PUBLICATIONS

Ghandhi et al., "Precisely Controlled . . . GaAs", Applied Physics Letters 38(4), Feb. 1981, pp. 267–269.
Shealy et al., "Open Tube Diffusion . . . Arsenide", IEEE, vol. EDL-1, No. 6, Jun. 1980, pp. 119–121.
Fukuzawa et al., "GaAlAs Buried Multiquantum . . . Disordering", Applied Physics Letters 45 (1), Jul. 1984, pp. 1–3.
Semura et al., "AlGaAs/GaAs . . . Guide", Japanese Journal of Applied Physics, vol. 24, No. 7, Jul. 1985, pp. L548–L550.

Primary Examiner—Brian E. Hearn
Assistant Examiner—Trung Dang
Attorney, Agent, or Firm—Leydig, Voit & Mayer

[57] ABSTRACT

A method of diffusing Zn into AlGaInP using $Al_xG_{1-x}As$ ($0 \leq x \leq 1$) as a diffusion stopping at a position of predetermined depth from the surface of the AlGaInP, or using $Al_xGa_{1-x}As$ ($0 \leq x \leq 1$) as a diffusion mask which is disposed on the surface of the AlGaInP.

6 Claims, 5 Drawing Sheets ured of 570° C. for an hour by the prior art method,
METHOD OF DIFFUSING ZN INTO COMPOUND SEMICONDUCTOR

FIELD OF THE INVENTION

The present invention relates to a diffusion method for III-V group compound semiconductors, and; more particularly to a method of diffusing Zn into AlGaInP which is used for a visible light semiconductor laser.

BACKGROUND OF THE INVENTION

A semiconductor laser comprising AlGaInP has the shortest oscillation wavelength among III-V group compound semiconductors. The operating wavelength is 0.63 microns. This laser draws attention as one which can be used in place of a helium neon laser. In a production of a semiconductor laser, Zn or the like is diffused into a semiconductor layer so as to change the refractive index or the conductivity type thereof.

FIG. 4 shows a cross-sectional view of a prior art method of diffusing Zn into AlGaInP.

In FIG. 4, reference numeral 1 designates a GaAs substrate. An $Al_{0.25}Ga_{0.25}In_{0.5}P$ layer 2 is deposited on the GaAs substrate 1 by MOCVD or MBE. A $Si_3N_4$ diffusion mask 4 is deposited on a portion of the $Al_{0.25}Ga_{0.25}In_{0.5}P$ layer 2 by CVD. A mixed layer of ZnO and $SiO_2$ 5 is deposited on the $Al_{0.25}Ga_{0.25}In_{0.5}P$ layer 2 and the diffusion mask 4 to a thickness of 1500 Angstroms by sputtering method. Herein, the weight ratio of ZnO to $SiO_2$ is 9:1. A $SiO_2$ protection layer 6 is deposited on the mixed layer 5 to a thickness of 1000 Angstroms by sputtering. Reference numeral 7 designates a Zn diffusion region.

The diffusion process will be described.

A sample obtained by depositing the $Si_3N_4$ diffusion mask 4, $ZnO:SiO_2$ mixture layer 5, and the $SiO_2$ protection layer 6 on the $Al_{0.25}Ga_{0.25}In_{0.5}P$ layer 2 is set in a diffusion furnace, and annealed at a temperature of 570° C. in a nitrogen or hydrogen ambient atmosphere for an hour. The Zn of the $ZnO:SiO_2$ mixed layer 5 is diffused into the $Al_{0.25}Ga_{0.25}In_{0.5}P$ layer 2 to a depth of about 1.3 microns. In order to precisely control the diffusion depth, it is necessary to precisely control the diffusion temperature and time. Further, in order to control the concentration of the diffusion region, it is also necessary to precisely control the temperature and time.

In this prior art diffusion method, the diffusion depth and the concentration of the diffusion region cannot be precisely controlled without precisely controlling the diffusion time and temperature. When the diffusion is actually conducted, variations in film thickness and the composition of the AlGaInP layer on one wafer and variations in AlGaInP layer thicknesses on different wafers need to be considered. It is difficult to place the diffusion front repeatedly at a position of predetermined depth in the entire wafer. Furthermore, when the temperature is set lower in order to reduce the diffusion speed, the diffusion time can be easily controlled, but the Zn concentration in the diffusion region is lowered, thereby adversely affecting the device characteristics.

Furthermore, the $Si_3N_4$ generally employed as a diffusion mask, is produced by sputtering in an apparatus different from that in which the semiconductor layers are grown, thereby complicating the production process.

SUMMARY OF THE INVENTION

The present invention is directed to solving the above-described problems and has for its object a method of diffusing Zn into a compound semiconductor that precisely controls the diffusion depth in diffusing Zn into AlGaInP, and simplifies the process for producing a device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, when Zn is diffused into AlGaInP, Zn is diffused using an $Al_xGa_{1-x}As$ ($0 \leq x \leq 1$) layer as a diffusion stopping layer which is disposed at a predetermined depth in an AlGaInP layer or using an $Al_xGa_{1-x}As$ ($0 \leq x \leq 1$) layer as a diffusion mask. Accordingly, the Zn diffusion depth can be precisely controlled. Furthermore, the $Al_xGa_{1-x}As$ ($0 \leq x \leq 1$) layer diffusion mask can be disposed subsequent to the growth of respective layers, thereby simplifying the production process.

DETAILED DESCRIPTION OF THE DRAWINGS

Figure 1:
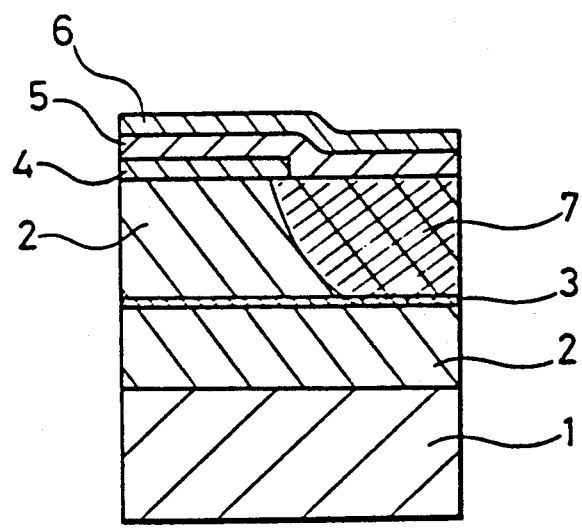
Figure 4:
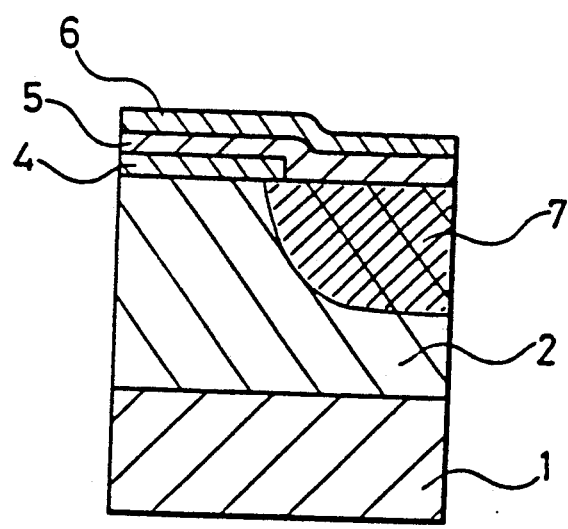
Figure 5:
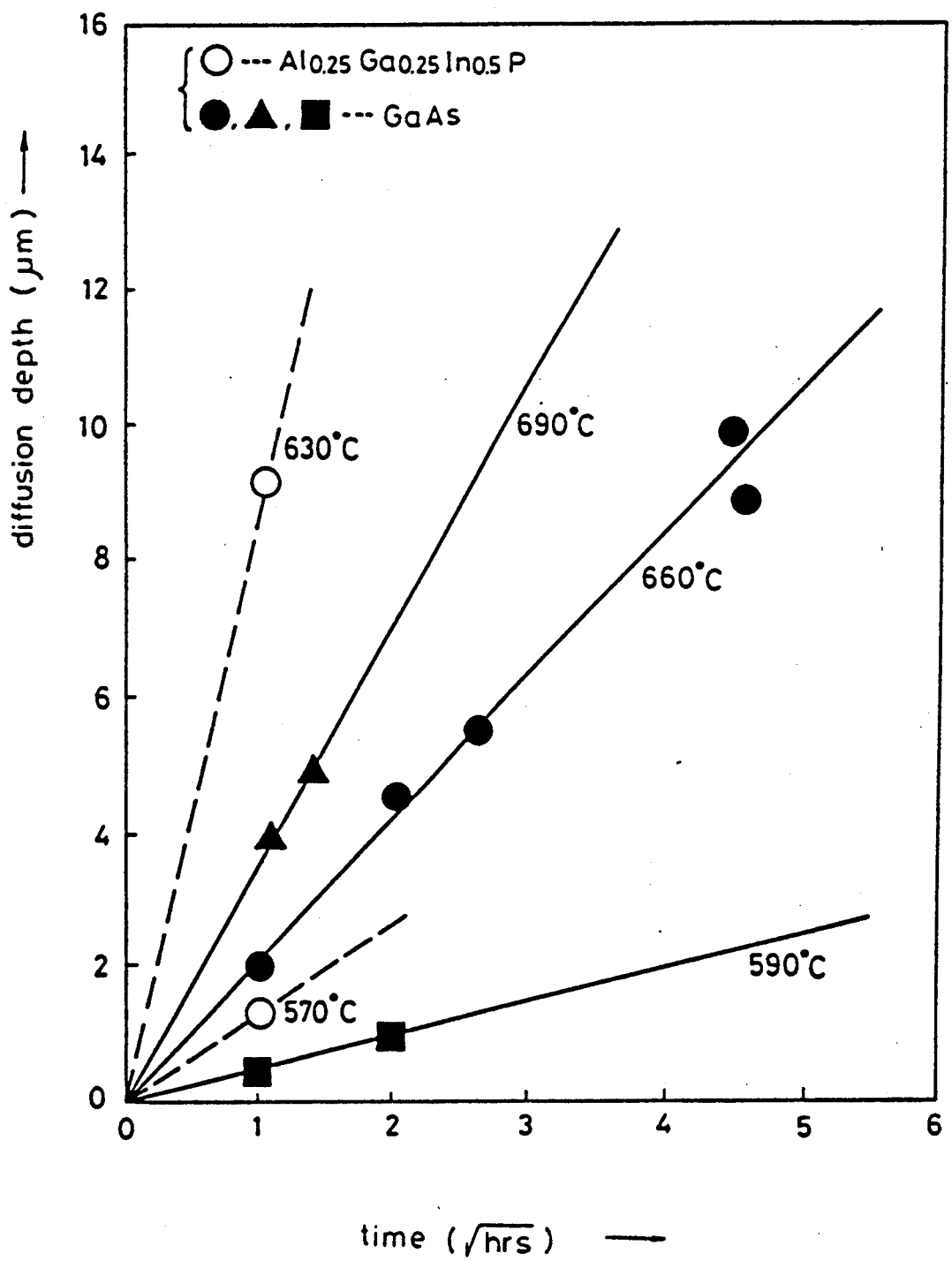

FIG. 1 is a cross-sectional view illustrating a method of diffusing Zn into a compound semiconductor according to a first embodiment of the present invention;

FIGS. 2(a) to 2(d) are cross-sectional views of process steps for producing a laser diode according to a second embodiment of the present invention;

FIGS. 3(a) to 3(d) are cross-sectional views of process steps for producing a laser diode according to a third embodiment of the present invention;

FIG. 4 is a cross-sectional view showing a method of diffusing Zn into a compound semiconductor according to the prior art; and FIG. 5 is a diagram showing Zn diffusion speed into AlGaInP and GaAs according to the present invention.

DETAILED DESCRIPTION OF THE PREFERRED EMBODIMENTS

An embodiment of the present invention will be described in detail with reference to the drawings.

FIG. 1 is a cross-sectional view illustrating a method of diffusing Zn into a compound semiconductor according to a first embodiment of the present invention. In FIG. 1, the same reference numerals designate the same elements as those shown in FIG. 4, and reference numeral 3 designates a AlGaAs diffusion stopping layer. FIG. 5 is a diagram showing Zn diffusion speed in AlGaInP and GaAs.

When Zn is diffused into $Al_{0.25}Ga_{0.25}In_{0.5}P$ at a temperature of 570° C. for an hour by the prior art method, Zn is diffused to a depth of about 1.3 microns. On the other hand, when the diffusion is into GaAs under the same conditions as above, Zn is diffused to a depth of only 0.4 microns. Furthermore, when the diffusion is into $Al_{0.25}Ga_{0.25}In_{0.5}P$ at a temperature of 630° C. for an hour, Zn is diffused to a depth of about 9 microns, but when it is diffused into GaAs, the diffusion depth is only 1 micron.

A case where the diffusion depth is set to 1.3 microns will be described.

In FIG. 1, the diffusion stopping layer 3 is disposed at a position of 1.3 microns depth from the surface of the $Al_{0.25}Ga_{0.25}In_{0.5}P$ layer 2. The film thickness of the diffusion stopping layer 3 is about 0.1 microns. When diffusion is carried out at 570° C. for an hour, Zn is diffused to a depth of about 1.3 microns. However, the diffusion varies due to the factors such as a slight changes in temperature or variations in the film thickness and composition of AlGaInP, and as a result, the diffusion front reaches the diffusion stopping layer 2 in some regions, but it does not reach thereto in other regions. Then, by carrying out the diffusion for a slightly longer time, for example, 70 and 80 minutes, the diffusion front reaches the diffusion stopping layer 2 throughout an entire wafer or in the respective wafers. On the other hand, since the Zn diffusion speed is reduced in the diffusion stopping layer 2, substantial diffusion depth is obtained where the diffusion stopping layer 2 is provided, thereby enabling control of the diffusion depth at high reproducibility through-out an entire wafer.

As described above, in this first embodiment, since Zn is diffused into AlGaAs using aAlGaAs layer having a lower Zn diffusion speed than that of AlGaInP and disposed at a predetermined depth, the Zn diffusion front can be precisely controlled at high reproducibility throughout an entire wafer by carrying out the diffusion for a slightly longer time.

A second embodiment of the present invention in which $Al_xGa_{1-x}As$ ($0 \leq x \leq 1$) layer is employed as a diffusion mask will be described.

FIGS. 2(a) to 2(d) show cross-sectional views of process steps for producing a laser diode according to the second embodiment of the present invention. In the figures, reference numeral 21 designates an n type GaAs substrate. Reference numeral 13 designates a GaAs diffusion mask layer. Reference numeral 5 designates a $ZnO:SiO_2$ mixed film. Reference numeral 6 designates an $SiO_2$ film. Reference numeral 7 designates a Zn diffusion region. Reference numeral 8 designates an n type $Al_{0.25}Ga_{0.25}In_{0.5}P$ lower cladding layer. Reference numeral 9 designates an n type $Ga_{0.5}In_{0.5}P$ active layer. Reference numeral 10 designates an n type $Al_{0.25}Ga_{0.25}In_{0.5}P$ upper cladding layer. Reference numeral 11 designates a p type $Al_{0.25}Ga_{0.25}In_{0.5}P$ current blocking layer. And reference numeral 12 designates an n type $Ga_{0.5}In_{0.5}P$ cap layer.

The production process will be described.

Figure 2A:
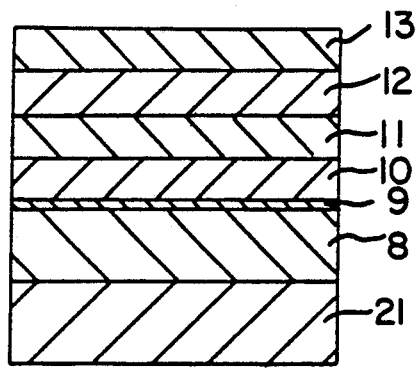
Figure 2B:
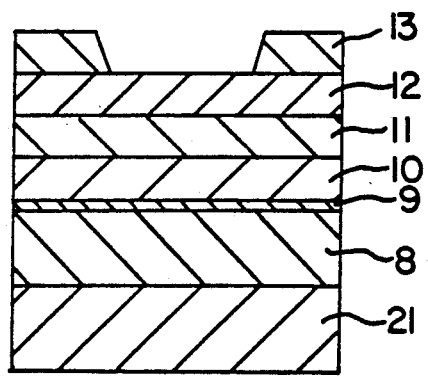
Figure 2C:
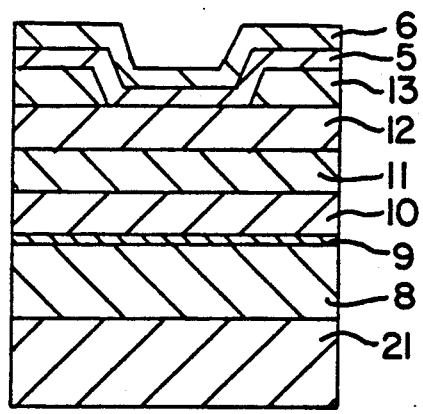
Figure 2D:
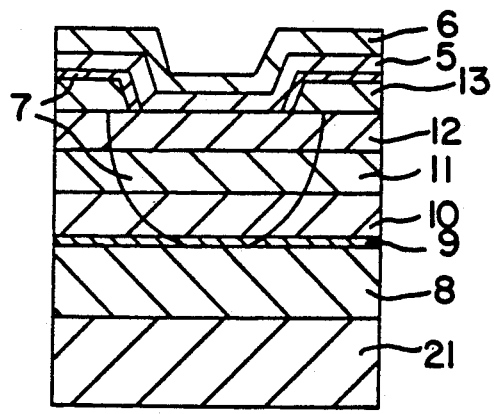

First of all, as shown in FIG. 2(a), a lower cladding layer 8, an active layer 9, an upper cladding layer 10, a current blocking layer 11, a cap layer 12, and a GaAs diffusion mask layer 13 are successively grown on a GaAs substrate 21. Next, a portion of the GaAs diffusion mask layer 13 is removed by etching as shown in FIG. 2(b). Next, as shown in FIG. 2(c), the $ZnO:SiO_2$ mixed film 5 and the $SiO_2$ film 6 are deposited thereon by sputtering. Then, this wafer is set in the diffusion furnace, and as shown in FIG. 2(d), Zn in the $ZnO:SiO_2$ mixed film 5 is diffused into the wafer until the diffusion front reaches the active layer 9. In this laser diode, the Zn diffusion portion of the active layer 9 has a different refractive index from that to which Zn has not diffused, and the transverse mode of the laser can be controlled.

As described above, in the conventional method, a $Si_3N_4$ film is generally employed for the diffusion mask. Therefore, after successively growing the lower cladding layer 8, the active layer 9, the upper cladding layer 10, the current blocking layer 11, and the cap layer 12 on the GaAs substrate 21, this wafer is transferred into another apparatus to deposit the $Si_3N_4$ film. In this second embodiment, however, GaAs a layer having a lower Zn diffusion speed than that of AlGaInP is employed as the diffusion mask. Accordingly, after successively growing the layers from the lower cladding layer 8 to the cap layer 12, the GaAs mask layer 13 can be subsequently grown thereon in the same apparatus, thereby reducing the number of production processes.

Next, a third embodiment of the present invention in which $Al_xGa_{1-x}As$ ($0 \leq x \leq 1$) layer is employed for both the diffusion stopping layer and the diffusion mask will be described.

FIGS. 3(a) to 3(d) are cross-sectional views of process steps for producing a laser diode in which transverse mode control and narrowing of current path are achieved according to the third embodiment of the present invention. In the figures, reference numeral 31 designates a p type GaAs substrate. Reference numeral 38 designates a p type $Al_{0.25}Ga_{0.25}In_{0.5}P$ cladding layer. Reference numeral 39 designates an n type $Ga_{0.5}In_{0.5}P$ active layer. Reference numerals 40a and 40b designate n type $Al_{0.25}Ga_{0.25}In_{0.5}P$ cladding layers. Reference numeral 42 designates an n type $Ga_{0.5}In_{0.5}P$ cap layer. Reference numeral 41 designates a light guiding layer comprising a GaInP/AlGaInP series superlattice. Reference numerals 23a and 23b designate an n type AlGaAs diffusion stopping layer and a GaAs diffusion mask layer, respectively. The film thickness of the n type AlGaInP cladding layer 40a is about 0.25 microns.

The production process will be described.

Figure 3A:
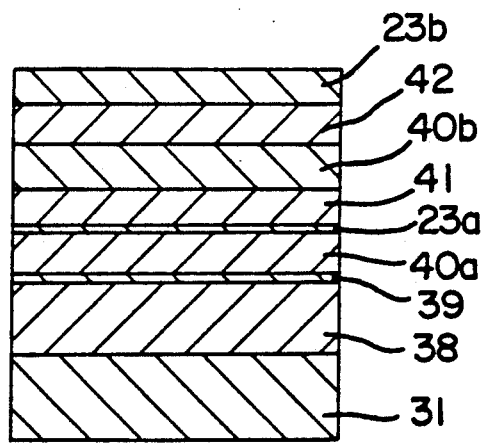
Figure 3B:
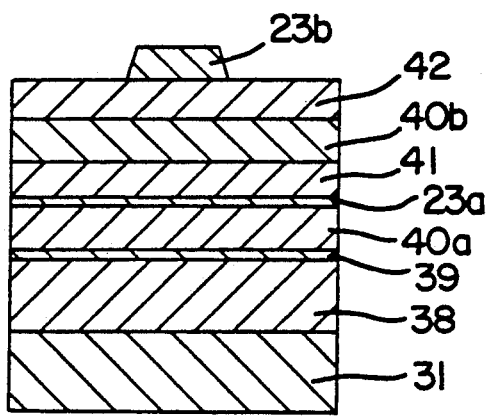
Figure 3C:
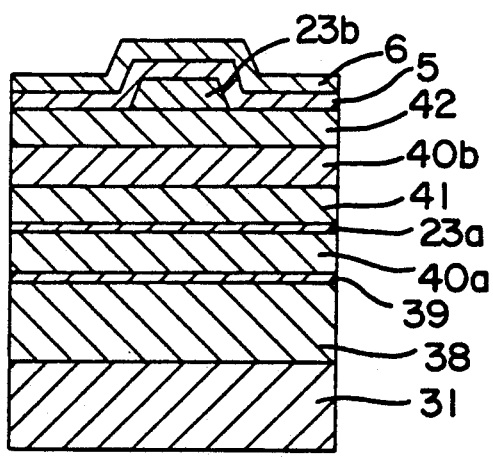
Figure 3D:
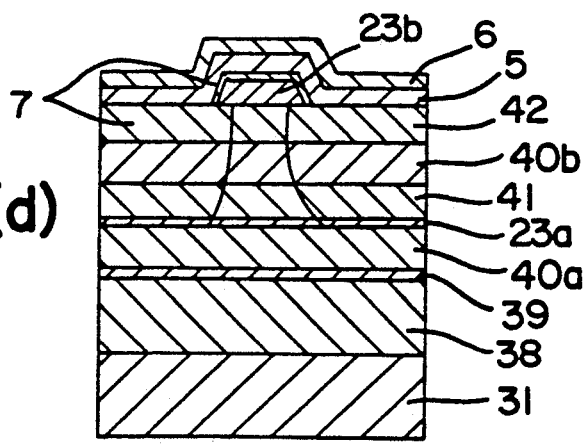

First of all, as shown in FIG. 3(a), layers from the p type AlGaInP cladding layer 38 to the GaAs diffusion mask layer 23b are successively grown on the p type GaAs substrate. There after a portion of the GaAs diffusion mask layer 23b is removed by etching to leave a portion in a stripe configuration as shown in FIG. 3(b). Next, as shown in FIG. 3(c), the $ZnO:SiO_2$ mixture film 5 and the $SiO_2$ film 6 are deposited thereon by sputtering. Then, this wafer is set in the diffusion furnace, and as shown in FIG. 3(d), Zn in the $ZnO:SiO_2$ mixture film 5 is diffuses into the wafer.

The operation of this laser diode will be described.

The superlattice is disordered in the Zn diffusion region in the lightguide layer 41 and has a lower refractive index than the region where Zn is not diffused. Since the layer thickness of the n type AlGaInP cladding layer 40a is as thin as 0.25 microns, a portion of the light generated in the active layer 39 leaks to the lightguide layer 41. Therefore, there is a refractive index distribution in the transverse direction that produces alight waveguide mechanism. Accordingly, the light generated at the active layer 39 is confined not only in the layer thickness direction due to the upper and lower cladding layers 40a and 40b but also in the transverse direction, thereby controlling the transverse mode. Furthermore, since the Zn diffusion region is p type, the n type AlGaInP cladding layer 40a and the n type GaInP active layer 39, and the p type AlGaInP cladding layer 38 comprise a pnp structure, and no current flows therethrough, that is, a narrowed current path structure for concentrating the current at the central portion of the wafer is narrowed.

In producing this laser structure, the diffusion stopping layer 23a functions effectively. That is, when the diffusion is too shallow, the lightguide layer 41 comprising the superlattice is not disordered enough, and it does not have a refractive index distribution in the transverse direction. On the other hand, when the diffusion is too deep and reaches the p type AlGaInP cladding layer 38, the current flows from the diffusion region through the p type AlGaInP cladding layer 38, and the laser does not emit light. Accordingly, it is very important to control the diffusion depth, meaning that the diffusion stopping layer 23a has a very significant effect.

While in the above-described embodiments Zn is diffused into $Al_{0.25}Ga_{0.25}In_{0.5}P$, Zn may be diffused into AlGaInP of an other composition ratios.

As is evident from the foregoing description, according to the present invention, Zn is diffused using the $Al_xGa_{1-x}As$ ($0 \leq x \leq 1$) layer as the diffusion stopping layer or a diffusion mask, which has a lower Zn diffusion speed than that of AlGaInP, thereby precisely controlling the diffusion depth throughout an entire wafer. Furthermore, the $Al_xGa_{1-x}As$ ($0 \leq x \leq 1$) diffusion mask can be produced subsequently to the respective layers within the same crystal growth apparatus, thereby simplifying the production process.

What is claimed is:

1. A method of producing a laser diode comprising:
   successively growing a lower cladding layer, an active layer, an upper cladding layer, a current blocking layer, a cap layer, and an $Al_xGa_{1-x}As$ ($0 \leq x \leq 1$) diffusion mask layer on a substrate;
   removing a portion of said diffusion mask to expose a portion of said cap layer;
   successively depositing a mixed film including Zn and a protection layer on said diffusion mask layer and said exposed portion of said cap layer; and
   diffusing Zn from said mixed layer through said exposed portion of said cap layer, through said current blocking and upper cladding layers underlying said exposed portion of said cap layer and into said active layer.

2. A method of producing a laser diode as defined in claim 1 wherein said substrate comprises GaAs, said lower and upper cladding layers and said current blocking layer comprise $Al_{0.25}Ga_{0.25}In_{0.5}P$, said active layer and said cap layer comprise $Ga_{0.5}In_{0.5}P$, and said diffusion mask layer comprises GaAs.

3. A method of producing a laser diode as defined in claim 1 wherein said mixed film comprises ZnO and $SiO_2$, and said protection layer comprises $SiO_2$.

4. A method of producing a laser diode comprising:
   successively growing a lower cladding layer, an active layer, a first upper cladding layer, an $Al_xGa_{1-x}As$ ($0 \leq x \leq 1$) diffusion stopping layer, a light guide layer, a second upper cladding layer, a cap layer, and an $Al_xGa_{1-x}As$ ($0 \leq x \leq 1$) diffusion mask layer on a substrate;
   removing a portion of said diffusion mask layer to leave a stripe configuration mask and to expose portions of said cap layer at both sides of said stripe mask;
   successively depositing a mixed film containing Zn and a protection film on said diffusion stripe mask and said cap layer at both sides of said stripe mask; and
   diffusing Zn from said mixed film at both sides of the stripe mask through said cap, second upper cladding layer, and light guide layer and into said diffusion striping layer underlying said exposed portions of said cap layer.

5. A method of producing a laser diode as defined in claim 4, wherein said substrate comprises GaAs, said lower and said first and second upper cladding layers comprise $Al_{0.25}Ga_{0.25}In_{0.5}P$, said active layer comprises $Ga_{0.5}In_{0.5}P$, said light guide layer comprises a GaInP/AlGaInP superlattice, said cap layer comprises $Ga_{0.5}In_{0.5}P$, and said diffusion mask layer comprises GaAs.

6. A method of producing a laser diode as defined in claim 4 wherein said mixed film comprises ZnO and $SiO_2$, and said protection layer comprises $SiO_2$.

* * * * *

UNITED STATES PATENT AND TRADEMARK OFFICE
CERTIFICATE OF CORRECTION

PATENT NO. : 5,023,199

DATED : June 11, 1991

INVENTOR(S) : Murakami et al

It is certified that error appears in the above-identified patent and that said Letters Patent is hereby corrected as shown below:

Title Page:
　　In item [57], the Abstract, line 2, change "$Al_xG_{1-x}As(0 \leqq x \leqq 1)$" to --$Al_xGa_{1-x}As(0 \leqq x \leqq 1)$--.

Column 6, claim 4, line 26, change "striping" to --stopping--.

claim 5, line 35, change "$5In_{0.5}P$" to --$_5In_{0.5}P$--.

Signed and Sealed this

Sixth Day of October, 1992

Attest:

DOUGLAS B. COMER

Attesting Officer　　　　Acting Commissioner of Patents and Trademarks